(12) United States Patent
Lin et al.

(10) Patent No.: US 12,013,649 B1
(45) Date of Patent: Jun. 18, 2024

(54) CLAMPING APPLIANCE OF RETICLE INNER POD

(71) Applicant: GUDENG EQUIPMENT CO., LTD., New Taipei (TW)

(72) Inventors: Ho-Yi Lin, New Taipei (TW); An-Pang Wang, New Taipei (TW); Yu-Lin Chen, New Taipei (TW); Po-Hsiang Chang, New Taipei (TW)

(73) Assignee: GUDENG EQUIPMENT CO., LTD., New Taipei (TW)

( * ) Notice: Subject to any disclaimer, the term of this patent is extended or adjusted under 35 U.S.C. 154(b) by 34 days.

(21) Appl. No.: 18/091,411

(22) Filed: Dec. 30, 2022

(51) Int. Cl.
*G03F 9/00* (2006.01)

(52) U.S. Cl.
CPC .................... *G03F 9/7096* (2013.01)

(58) Field of Classification Search
CPC ...................................... G03F 9/7096
See application file for complete search history.

(56) References Cited

U.S. PATENT DOCUMENTS

| | | | | |
|---|---|---|---|---|
| 7,453,549 B2* | 11/2008 | Suzuki | .................. | G03F 9/7084 355/75 |
| 8,446,570 B2* | 5/2013 | Del Puerto | ....... | H01L 21/67359 355/75 |
| 9,851,643 B2* | 12/2017 | Chilese | ............... | G03F 7/70741 |
| 2020/0335362 A1* | 10/2020 | Pan | ........................ | H01L 21/677 |
| 2021/0391198 A1* | 12/2021 | Raga-Barone | .......... | G03F 7/707 |
| 2022/0238329 A1* | 7/2022 | Yu | ..................... | H01L 21/68707 |
| 2022/0291596 A1* | 9/2022 | Chiu | .................... | G03F 7/70741 |

FOREIGN PATENT DOCUMENTS

| KR | 20210009783 A | * 1/2021 |
|---|---|---|
| TW | M635531 U | * 12/2022 |

\* cited by examiner

*Primary Examiner* — Terrell L McKinnon
*Assistant Examiner* — Ding Y Tan

(57) ABSTRACT

A clamping appliance of a reticle inner pod comprises: two clamping seats and a power member. The two clamping seats face each other in a width direction. The power member adjusts a distance of the two clamping seats in the width direction. The two clamping seats each include a bottom wall, two side walls, a first step and a second step. The two side walls are respectively disposed at two ends of the bottom wall. The first step and the second step are sequentially arranged above the bottom wall along the width direction. The two clamping seats each further include two eaves, the two eaves are respectively perpendicularly connected to the two side walls, so that the eave, the side wall and the bottom wall are clamped to form a cladding space with three-sided cladding.

7 Claims, 3 Drawing Sheets

CLAMPING APPLIANCE OF RETICLE INNER POD

BACKGROUND OF THE INVENTION

1. Field of the Invention

The present application relates to an appliance for clamping a working piece, and in particular to a clamping appliance of a reticle inner pod.

2. Description of the Related Art

In the semiconductor industry, in order to pursue a smaller critical dimension (CD) of integrated circuits, the current trend is to use extreme ultraviolet light processes. The extreme ultraviolet light process has a dedicated extreme ultraviolet light reticle and its protective box to avoid damage to the expensive reticle. The EUV inner pod (EIP) is for directly contacting with and bearing the reticle, in addition to a considerable number of standards to be followed, the reticle inner pod is also not resistant to dirt and wear. General automated instruments may bring various irreversible damage to the reticle inner pod, so there is currently a lack of appliances on the market that can firmly clamp the reticle inner pod.

BRIEF SUMMARY OF THE INVENTION

Therefore, in order to solve the various problems of the traditional fixture, the disclosure provides a clamping appliance of a reticle inner pod.

To achieve the above objective and other objectives, the present disclosure provides a clamping appliance of a reticle inner pod, which comprises: two clamping seats, the two clamping seats face each other in a width direction; and a power member, the power member connects at least one of the clamping seats by power to adjust a distance of the two clamping seats in the width direction, wherein the two clamping seats each include a bottom wall, two side walls, a first step and a second step, the bottom wall, the first step and the second step extend along a length direction perpendicular to the width direction, the two side walls are respectively disposed at two ends of the bottom wall, the first step and the second step are sequentially arranged above the bottom wall along the width direction, a top surface of the second step is higher than a top surface of the first step, and the top surface of the first step is higher than an upper surface of the bottom wall, wherein the two clamping seats each further include two eaves, the two eaves are respectively perpendicularly connected to the two side walls, so that the eave, the side wall and the bottom wall are clamped to form a cladding space with three-sided cladding.

In an embodiment of the present disclosure, the first step has two interrupted segments.

In an embodiment of the present disclosure, the two clamping seats each further include a standing wall, the first step, the second step and the standing wall are sequentially arranged above the bottom wall along the width direction, a top surface of the standing wall is higher than the top surface of the second step.

In an embodiment of the present disclosure, the eave is an extension of the standing wall.

In an embodiment of the present disclosure, a middle segment of the standing wall is provided with a hollow out part.

In an embodiment of the present disclosure, the clamping appliance of the reticle inner pod further comprises a connecting arm, connected to the two clamping seats.

In an embodiment of the present disclosure, the clamping appliance of the reticle inner pod further comprises a platform, disposed under the two clamping seats.

Accordingly, by the clamping appliance of the reticle inner pod of the present disclosure, the lower cover of the reticle pod and the upper cover of the reticle pod can be firmly clamped at the same time, or only one of them can be clamped separately, so that the various components of the reticle pod are not excessive sliding and controlled within the slide range of 0.3 mm. In addition, the corner part of the clamping seat is provided with a cladding space having three-sided cladding, which is especially suitable for cladding and clamping the corner parts of the reticle pod, so that the reticle pod can be firmly clamped in the width direction, length direction, and a height direction perpendicular to the width direction and length direction effectively, and thus the reticle pod can remain stable without slipping in the process of moving transmission or even flipping.

DETAILED DESCRIPTION OF THE INVENTION

Figure 1:
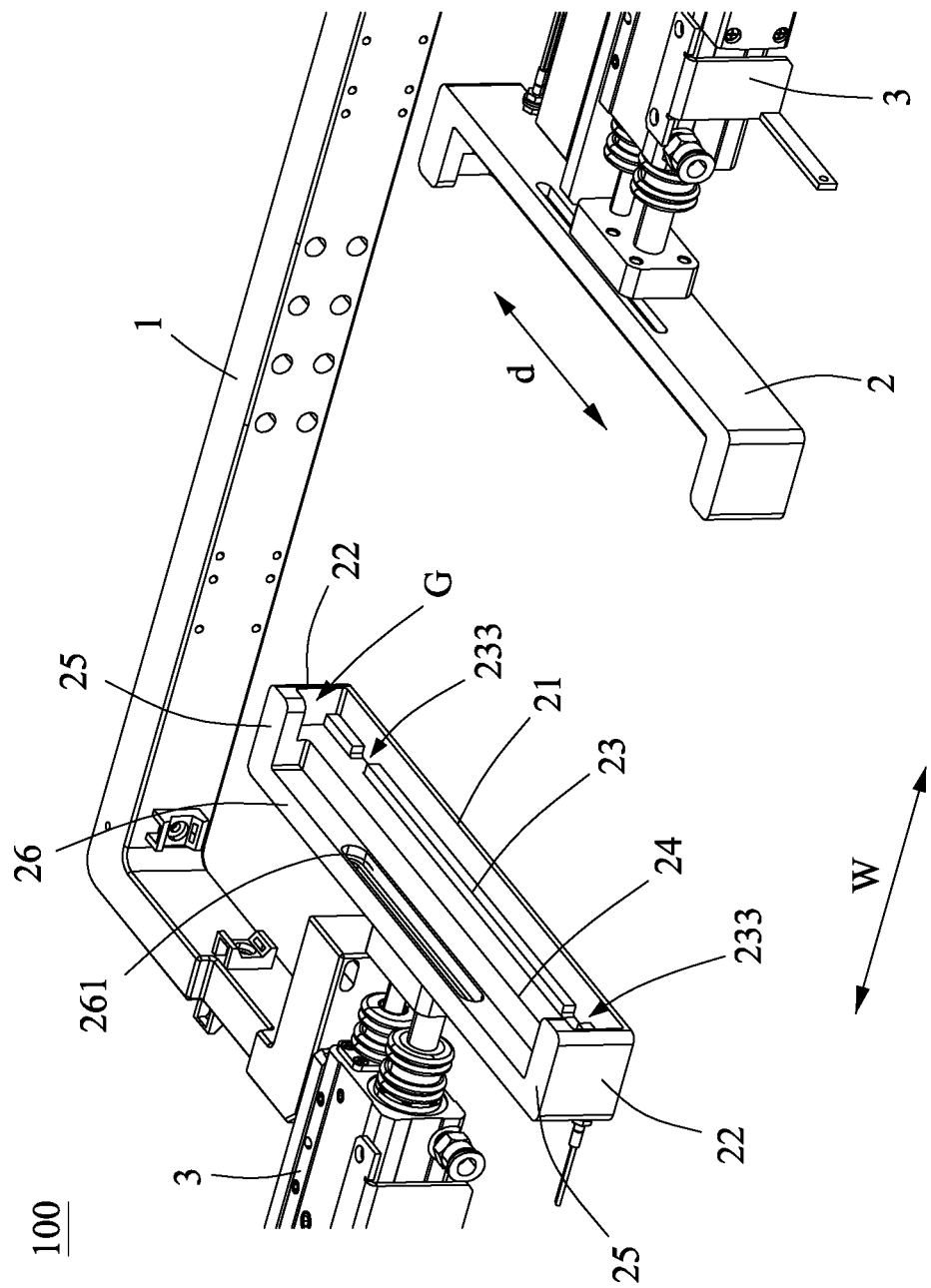
FIG. 1 is a schematic perspective view of a clamping appliance of a reticle inner pod according to an embodiment of the present disclosure.
Figure 2:
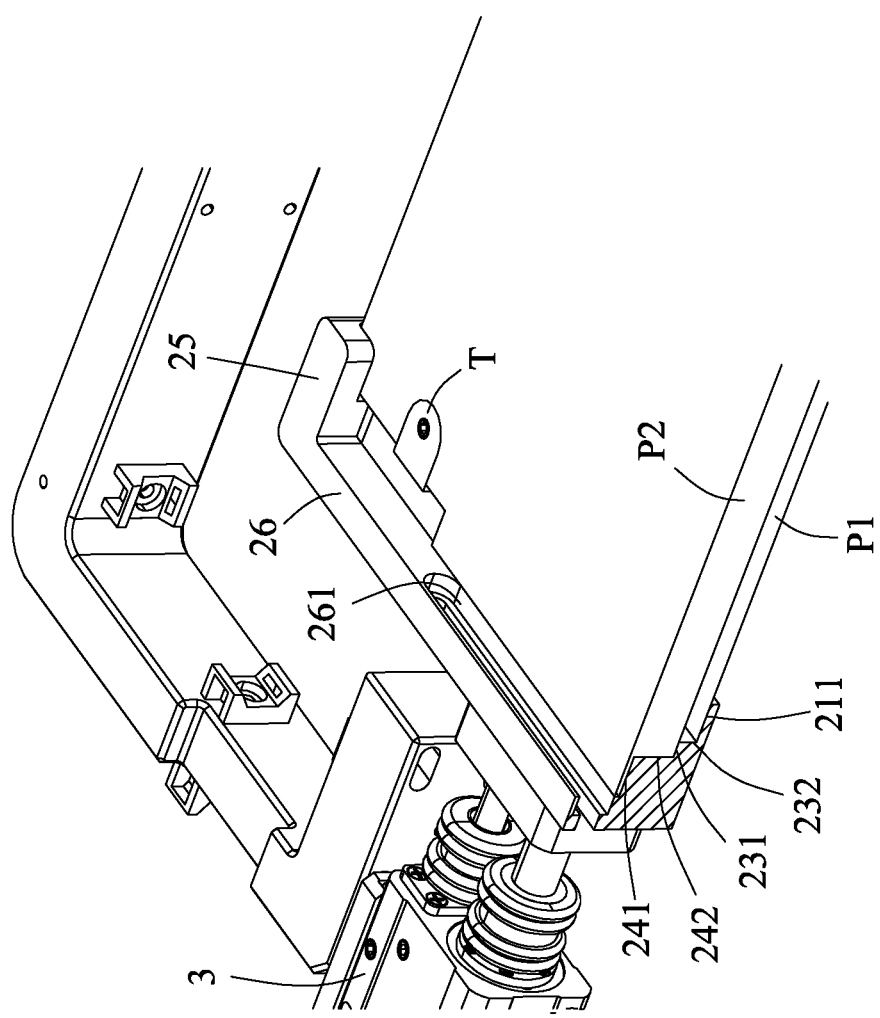
FIG. 2 is a partially schematic sectional view of the clamping appliance of the reticle inner pod according to the embodiment of the present disclosure
Figure 3:
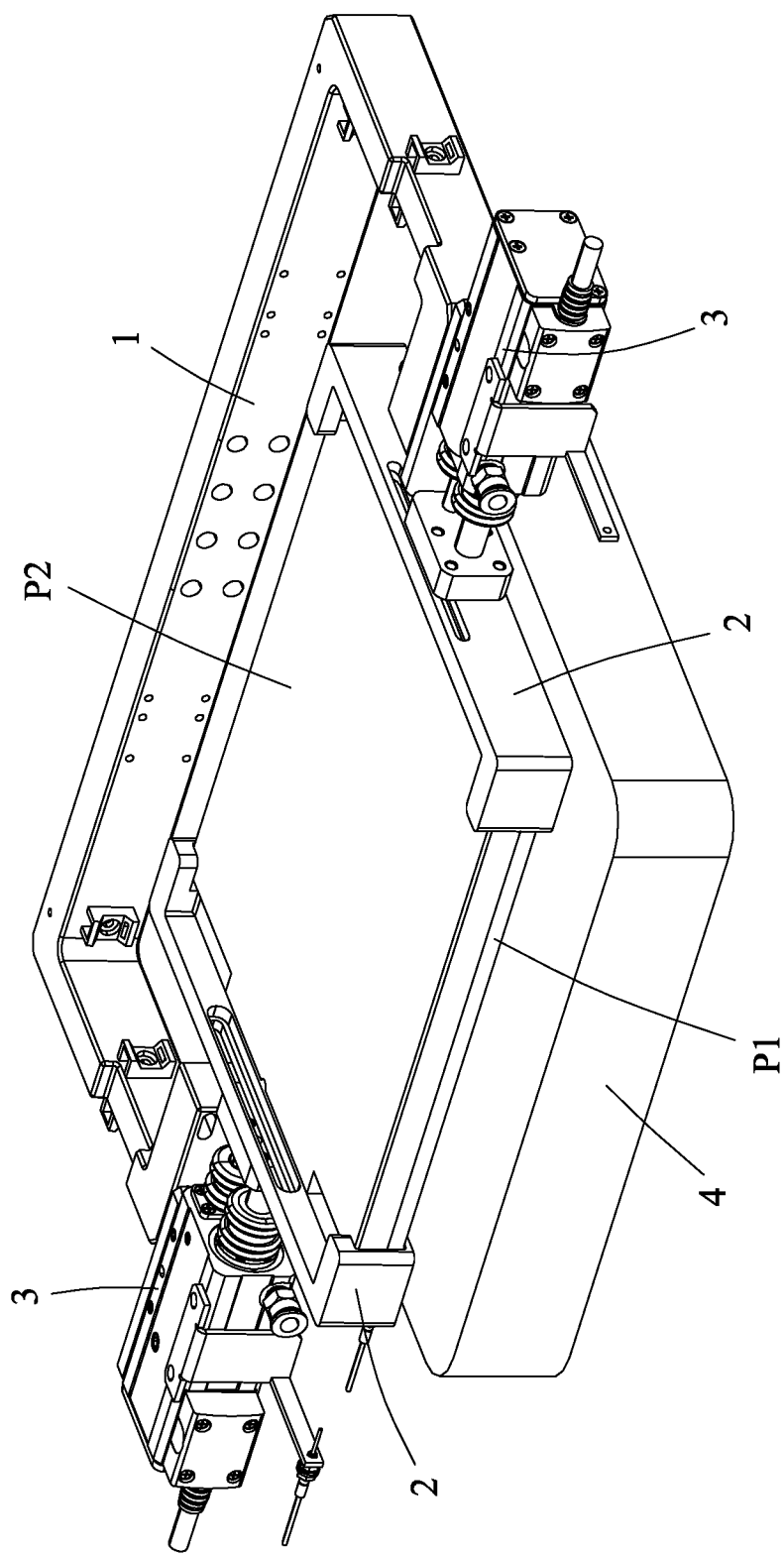
FIG. 3 is a schematic view of the clamping appliance of the reticle inner pod in clamping according to the embodiment of the present disclosure.

To facilitate understanding of the present application, embodiments together with the attached drawings for the detailed description of the present application are provided. One skilled in the art can understand the object, characteristics and effects of this present application by the content described in the specification. It should be noted that various possible modifications and alterations to the details of the specification could be carried out by implementing or applying other different embodiments based on different views and applications without departing from the spirit of the present application. The related technical contents of the application will be described in detail by the embodiments. However, the disclosed contents should not be considered to limit the scope of the application. The description is provided as follows:

As shown in FIG. 1 to FIG. 3, a clamping appliance 100 of a reticle inner pod of the embodiment of the present disclosure comprises: two clamping seats 2 and a power member 3.

The two clamping seats 2 face each other in a width direction W. Facing is defined as each clamping seat 2 having an opening for clamping a reticle pod, and the two clamping seats 2 face each other by the openings.

The power member 3 connects at least one of the clamping seats 2 by power to adjust a distance of the two clamping seats 2 in the width direction W. The power member 3, for example, is a cylinder or motor, which provides power to move a position of the clamping seat 2. In the present embodiment, the two clamping seats 2 are respectively connected to one power member 3, but the present disclosure is not limited to thereto, in other embodiments, only one clamping seat 2 may be connected to the power member 3, and the other clamping seat 2 is stationary.

The detailed structure of the clamping seat 2 is described below in detail. The structure of the two clamping seats 2 is mirror-symmetrical to each other, so it is not repeatedly displayed in the drawings.

As shown in FIG. 1 and FIG. 2, the two clamping seats 2 each include a bottom wall 21, two side walls 22, a first step 23 and a second step 24. The bottom wall 21, the first step 23 and the second step 24 extend along a length direction d perpendicular to the width direction W. The bottom wall 21 needs to have a length at least longer than a standard size of the reticle pod. The two side walls 22 are respectively disposed at two ends of the bottom wall 21, the first step 23 and the second step 24 are sequentially arranged above the bottom wall 21 along the width direction W, wherein a top surface 241 of the second step 24 is higher than a top surface 231 of the first step 23, and the top surface 231 of the first step 23 is higher than an upper surface 211 of the bottom wall 21. Thus, by the first step 23 and the second step 24 that are gradually heightening, and the two side walls 22 located at the two ends of the bottom wall 21, the clamping seat 2 forms the aforementioned opening for clamping the reticle pod in the width direction W.

As shown in FIG. 2, when the clamping appliance 100 of the reticle inner pod of the present disclosure performs clamping, the power member 3 outputs power to make the two clamping seats 2 close to each other, and then clamp the reticle pod. When clamping, a lower cover P1 of the reticle pod is born by the bottom wall 21, the lower cover P1 of the reticle pod is located on the upper surface 211 of the bottom wall 21, and the first step 23 of the clamping seat 2 tightly clamps the lower cover P1 of the reticle pod by a side surface 232 thereof. On the other hand, an upper cover P2 of the reticle pod is born by the lower cover P1 of the reticle pod below, and if there is no the lower cover P1 of the reticle pod, the top surface 231 of the first step 23 can also support the upper cover P2 of the reticle pod. Also, whether there is the lower cover P1 of the reticle pod or not, the upper cover P2 of the reticle pod is tightly clamped by a side surface 242 of the second step 24, and the top surface 241 of the second step 24 can accommodate a wing supporting the upper cover P2 of the reticle pod.

As shown in FIG. 1, the two clamping seats 2 each further include two eaves 25, the two eaves 25 are respectively perpendicularly connected to the two side walls 22, so that the eave 25, the side wall 22 and the bottom wall 21 are clamped to form a cladding space G with three-sided cladding. The cladding space G is especially suitable for cladding and clamping the corner parts of the reticle pod, so that the reticle pod can be firmly clamped in the width direction W, length direction d, and a height direction perpendicular to the width direction W and length direction d effectively, and thus the reticle pod can remain stable without slipping in the process of moving transmission or even flipping.

In summary, by the clamping appliance 100 of the reticle inner pod of the present disclosure, the lower cover P1 of the reticle pod and the upper cover P2 of the reticle pod can be firmly clamped at the same time, or only one of them can be clamped separately, so that the various components of the reticle pod are not excessive sliding and controlled within the slide range of 0.3 mm.

Further, as shown in FIG. 1, in one embodiment, the first step 23 has two interrupted segments 233. The interrupted segment 233 is a discontinuous area of the first step 23, which can be used to accommodate the guide member T of the reticle pod (as shown in FIG. 2). The guide member T, for example, is a guide member of the invention patent publication number 1755795 of Republic of China.

Further, the two clamping seats 2 each further include a standing wall 26, the first step 23, the second step 24 and the standing wall 26 are sequentially arranged above the bottom wall 21 along the width direction W, a top surface of the standing wall 26 is higher than the top surface 241 of the second step 24.

Further, the eave 25 is an extension of the standing wall 26, the standing wall 26 may make the structure of the eave 25 more stable.

Further, a middle segment of the standing wall 26 is provided with a hollow out part 261. The position of the hollow out part 261 directly corresponds to the wing of the upper cover P2 on the reticle, so that the wing can extend toward the hollow out part 261 without colliding with or wearing out with the standing wall 26.

Further, as shown in FIG. 1 and FIG. 3, the clamping appliance 100 of the reticle inner pod of the present disclosure further comprises a connecting arm 1, connected to the two clamping seats 2. The connecting arm 1 may fix and limit the distance and relative position between the two clamping seats 2, and enable the power member 3 to push the clamping seat 2 only in a certain range and in a specific direction.

Further, as shown in FIG. 3, the clamping appliance 100 of the reticle inner pod of the present disclosure further comprises a platform 4, disposed under the two clamping seats 2. The platform 4 can bear the reticle pod to be clamped, and makes the two clamping seats 2 easy to clamp and move the reticle pod from a side of the platform table 4.

While the present application has been described by means of specific embodiments, those skilled in the art should understand the above description is merely embodiments of the application, and it should not be considered to limit the scope of the application. It should be noted that all changes and substitutions which come within the meaning and range of equivalency of the embodiments are intended to be embraced in the scope of the application. Therefore, the scope of the application is defined by the claims.

What is claimed is:

1. A clamping appliance of a reticle inner pod, comprising:
   two clamping seats, the two clamping seats face each other in a width direction; and
   a power member, connecting at least one of the clamping seats by power to adjust a distance of the two clamping seats in the width direction,
   wherein the two clamping seats each include a bottom wall, two side walls, a first step and a second step, the bottom wall, the first step and the second step extend along a length direction perpendicular to the width direction, the two side walls are respectively disposed at two ends of the bottom wall, the first step and the second step are sequentially arranged above the bottom wall along the width direction, a top surface of the second step is higher than a top surface of the first step, and the top surface of the first step is higher than an upper surface of the bottom wall,
   wherein the two clamping seats each further include two eaves, the two eaves are perpendicularly connected to the two side walls, so that the eave, the side wall and the bottom wall are clamped to form a cladding space with three-sided cladding.

2. The clamping appliance of the reticle inner pod according to claim 1, wherein the first step has two interrupted segments.

3. The clamping appliance of the reticle inner pod according to claim 1, wherein the two clamping seats each further include a standing wall, the first step, the second step and the standing wall are sequentially arranged above the bottom wall along the width direction, a top surface of the standing wall is higher than the top surface of the second step.

4. The clamping appliance of the reticle inner pod according to claim 3, wherein the eave is an extension of the standing wall.

5. The clamping appliance of the reticle inner pod according to claim 3, wherein a middle segment of the standing wall is provided with a hollow out part.

6. The clamping appliance of the reticle inner pod according to claim 1, further comprising a connecting arm, connected to the two clamping seats.

7. The clamping appliance of the reticle inner pod according to claim 1, further comprising a platform, disposed under the two clamping seats.

\* \* \* \* \*